(12) United States Patent
Zhang et al.

(10) Patent No.: US 11,024,221 B2
(45) Date of Patent: Jun. 1, 2021

(54) PIXEL ARRANGEMENT STRUCTURE, METAL MASK, AND DISPLAY DEVICE

(71) Applicant: BOE Technology Group Co., Ltd., Beijing (CN)

(72) Inventors: Haohan Zhang, Beijing (CN); Yue Liu, Beijing (CN); Zhihui Xiao, Beijing (CN); Shanshan Bai, Beijing (CN); Yansong Li, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 96 days.

(21) Appl. No.: 16/192,496

(22) Filed: Nov. 15, 2018

(65) Prior Publication Data

US 2019/0251895 A1 Aug. 15, 2019

(30) Foreign Application Priority Data

Feb. 9, 2018 (CN) .......................... 201810134124.7

(51) Int. Cl.
| | |
|---|---|
| *G09G 3/32* | (2016.01) |
| *H01L 27/32* | (2006.01) |
| *H01L 51/56* | (2006.01) |
| *G09G 3/20* | (2006.01) |

(52) U.S. Cl.
CPC ............ *G09G 3/32* (2013.01); *G09G 3/2074* (2013.01); *H01L 27/3216* (2013.01); *H01L 27/3218* (2013.01); *H01L 51/56* (2013.01); *G09G 2300/0452* (2013.01)

(58) Field of Classification Search
CPC ............ H04N 13/305; H01L 51/5281; H01L 27/3218; H01L 51/0005; H01L 27/3216; H01L 51/56; G09G 3/32; G09G 2300/0452
USPC ............... 257/89; 313/500; 345/694; 348/58
See application file for complete search history.

(56) References Cited

U.S. PATENT DOCUMENTS

| | | | | |
|---|---|---|---|---|
| 2006/0033422 A1* | 2/2006 | Chao | .................... | H01L 27/3216 313/500 |
| 2014/0285642 A1* | 9/2014 | Hwang | ................ | H04N 13/305 348/58 |
| 2015/0379916 A1* | 12/2015 | Guo | ..................... | G09G 3/2003 345/694 |
| 2016/0155781 A1* | 6/2016 | Chaji | ................... | H01L 27/3218 257/89 |
| 2018/0197922 A1* | 7/2018 | Song | ................... | H01L 51/5281 |
| 2019/0214604 A1* | 7/2019 | Zhen | ................... | H01L 51/0005 |

* cited by examiner

*Primary Examiner* — Abdul-Samad A Adediran
(74) *Attorney, Agent, or Firm* — Arent Fox LLP; Michael Fainberg

(57) ABSTRACT

Disclosed are a pixel arrangement structure, a metal mask, and a display device, and in the pixel arrangement structure, each repeating element includes four sub-pixels distributed in two rows by two columns, where the four sub-pixels include two first sub-pixels in different rows and different columns, and one second sub-pixel and one third sub-pixel in different rows and different columns. While an image is being displayed, any one first sub-pixel together with one second sub-pixel adjacent thereto and one third sub-pixel adjacent thereto can constitute a light-emitting pixel, so that the image can be displayed at a high resolution using a physical low resolution through borrowing between the sub-pixels.

17 Claims, 10 Drawing Sheets

PIXEL ARRANGEMENT STRUCTURE, METAL MASK, AND DISPLAY DEVICE

CROSS-REFERENCE TO RELATED APPLICATION

This application claims priority of Chinese Patent Application No. 201810134124.7, filed on Feb. 9, 2018, which is hereby incorporated by reference in its entirety.

FIELD

The present disclosure relates to the field of display technologies, and particularly to a pixel arrangement structure, a metal mask, and a display device.

BACKGROUND

An Organic Light-Emitting Diode (OLED) display is one of focuses in the existing research field of flat panel displays, and has low power consumption, a low production cost, self-luminescence, a wide angle of view, a high response speed, and other advantages over a Liquid Crystal Display (LCD); and at present, the OLED display has come to take the place of the traditional liquid crystal display.

SUMMARY

A pixel arrangement structure according to an embodiment of the disclosure includes a plurality of repeating elements arranged in a matrix, wherein each of the repeating elements includes four sub-pixels distributed in two rows by two columns, and the four sub-pixels include two first sub-pixels in different rows and different columns, and one second sub-pixel and one third sub-pixel; the second sub-pixel and the third sub-pixel are in different rows and different columns.

Optionally, the pixel arrangement structure according to the embodiment of the disclosure includes at least one of following features:
  each of the first sub-pixels includes two sub-pixel components arranged in a mirror pattern;
  the second sub-pixel includes two sub-pixel components arranged in a mirror pattern; or
  the third sub-pixel includes two sub-pixel components arranged in a mirror pattern.

Optionally, in the pixel arrangement structure according to the embodiment of the disclosure, facing sides of two sub-pixel components arranged in a mirror pattern in a same sub-pixel are parallel to each other.

Optionally, in the pixel arrangement structure according to the embodiment of the disclosure, a shape of the sub-pixel components is a semicircle or a semi-ellipse.

Optionally, in the pixel arrangement structure according to the embodiment of the disclosure, the two sub-pixel components arranged in a mirror pattern are arranged in a row or column direction.

Optionally, in the pixel arrangement structure according to the embodiment of the disclosure, a shape of a sub-pixel adjacent to a sub-pixel component in a column direction is an abnormally-shaped quadrilateral, and a side of the abnormally-shaped quadrilateral proximate to the sub-pixel component is an inward concave arc.

Optionally, in the pixel arrangement structure according to the embodiment of the disclosure, a shape of a sub-pixel adjacent to a sub-pixel component in the row direction is an abnormally-shaped quadrilateral, and a side of the abnormally-shaped quadrilateral proximate to the sub-pixel component is an inward concave arc.

Optionally, in the pixel arrangement structure according to the embodiment of the disclosure, facing sides of two adjacent sub-pixels in the column direction are parallel to each other.

Optionally, in the pixel arrangement structure according to the embodiment of the disclosure, facing sides of two adjacent sub-pixels in the row direction are parallel to each other.

Optionally, in the pixel arrangement structure according to the embodiment of the disclosure, the first sub-pixels, the second sub-pixel, and the third sub-pixel are one of a blue sub-pixel, red sub-pixel, and green sub-pixel; the first sub-pixels, the second sub-pixel and the third sub-pixel are different in color.

Optionally, in the pixel arrangement structure according to the embodiment of the disclosure, an area of the blue sub-pixel is larger than an area of the green sub-pixel, and an area of the blue sub-pixel is larger than an area of the red sub-pixel.

Optionally, the pixel arrangement structure according to the embodiment of the disclosure includes at least one of following features:
  the smallest spacings between each two adjacent sub-pixels in the row direction are equal; and
  the smallest spacings between each two adjacent sub-pixels in the column direction are equal.

Optionally, in the pixel arrangement structure according to the embodiment of the disclosure, the smallest spacings between two adjacent sub-pixels in the row direction are equal to the smallest spacings between two adjacent sub-pixels in the column direction.

Correspondingly, an embodiment of the disclosure further provides a metal mask for fabricating the pixel arrangement structure above according to the embodiment of the disclosure, the metal mask including a plurality of opening areas corresponding in shape and position to the first sub-pixels, the second sub-pixel, or the third sub-pixel.

Correspondingly, an embodiment of the disclosure further provides a display device including the pixel arrangement structure above according to the embodiment of the disclosure.

DETAILED DESCRIPTION OF THE EMBODIMENTS

Figure 1:
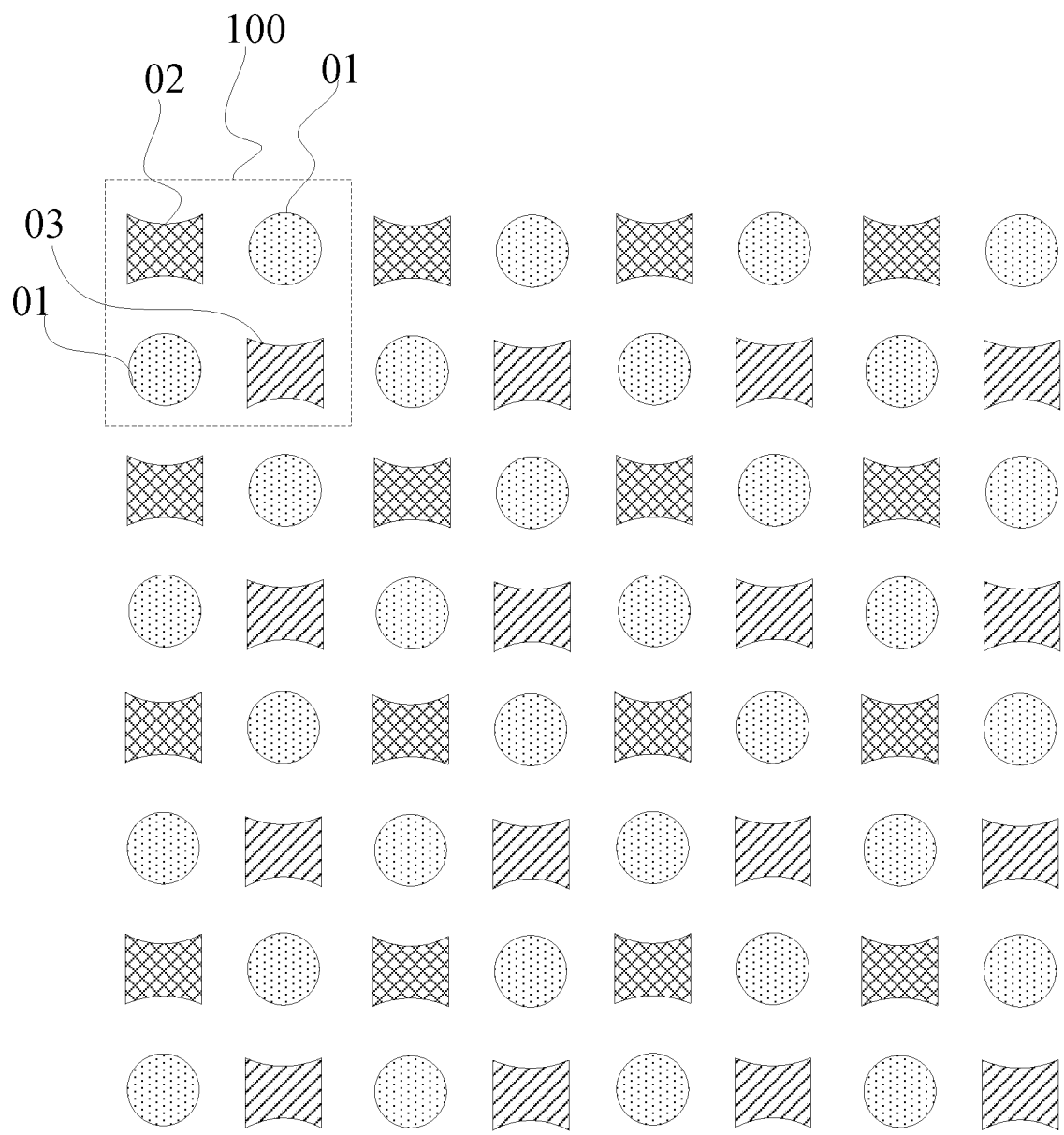
FIG. 1 is a schematic structural diagram of a pixel arrangement structure according to an embodiment of the disclosure.

In order to make the objects, technical solutions, and advantages of the disclosure more apparent, the disclosure will be described below in further details with reference to the drawings, and apparently the embodiments described below are only a part but not all of the embodiments of the disclosure. Based upon the embodiments here of the disclosure, all the other embodiments which can occur to those ordinarily skilled in the art without any inventive effort shall fall into the scope of the disclosure.

The shapes and sizes of respective components in the drawings are not intended to reflect any real proportion, but only intended to illustrate the disclosure of the disclosure.

The structure of the OLED display generally includes an base substrate, and sub-pixels fabricated and arranged in a matrix on the base substrate, where the respective sub-pixels are typically formed as organic electroluminescent structures of an organic material at the positions of the corresponding sub-pixels on the array substrate using a metal mask through vapor-plating. Since the size of a sub-pixel is determined directly by the size of an opening of the metal mask, a fabrication process is limited by the metal mask in that a high-definition display device cannot be fabricated using the existing traditional arrangement structure of RGB pixels.

As illustrated in FIG. 1 to FIG. 6, a pixel arrangement structure according to an embodiment of the disclosure includes a plurality of repeating elements 100 arranged in a matrix, where each repeating element 100 includes four sub-pixels distributed in two rows by two columns, and the four sub-pixels include two first sub-pixels 01 in different rows and different columns, and one second sub-pixel 02 and one third sub-pixel 03 in different rows and different columns.

Figure 7:
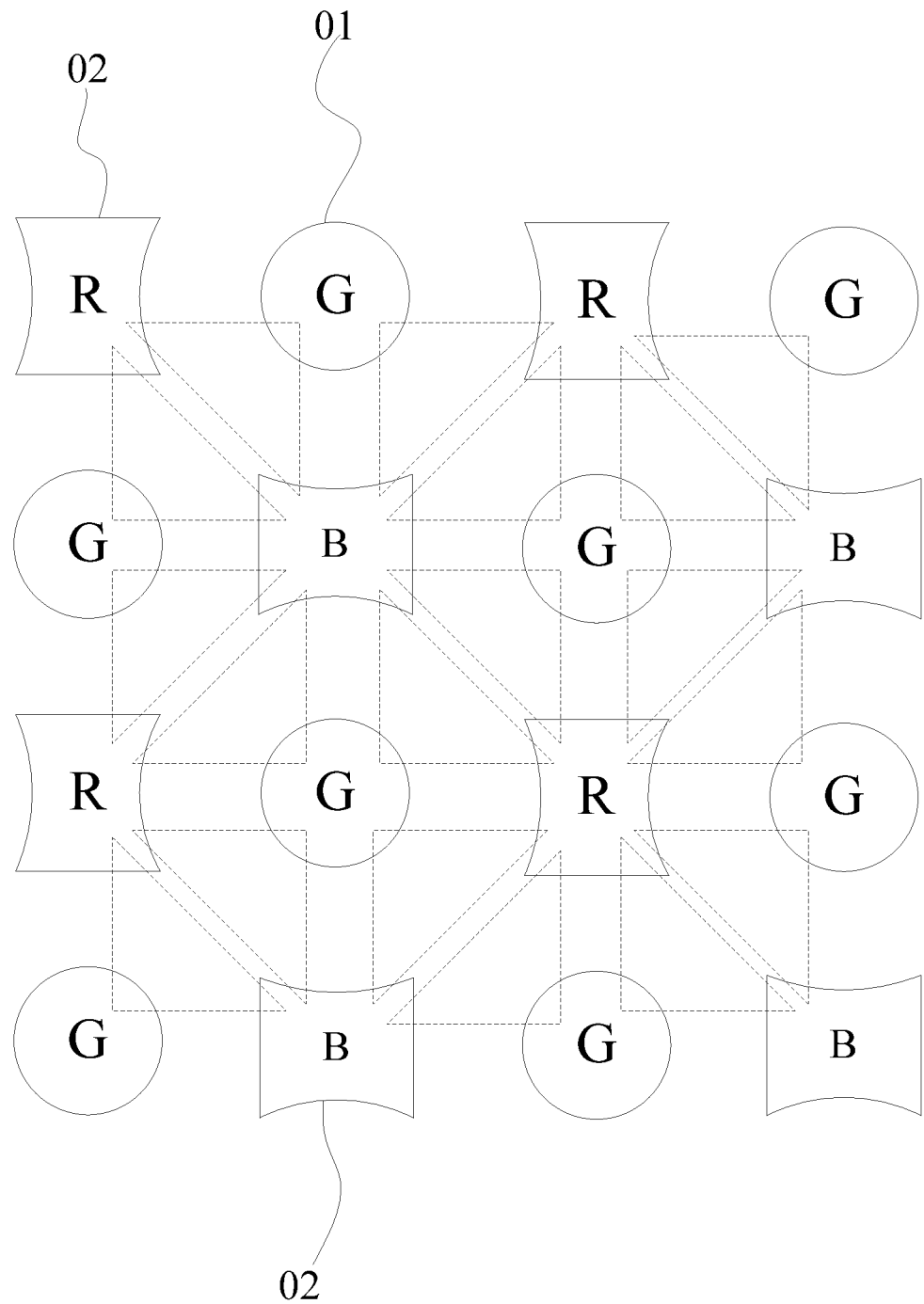
FIG. 7 is a schematic structural diagram of borrowing a sub-pixel in the pixel arrangement structure according to the embodiment of the disclosure.

Optionally, in the pixel arrangement structure according to the embodiment of the disclosure, as illustrated in FIG. 7, while an image is being displayed, any first sub-pixel 01 together with one second sub-pixel adjacent thereto and one third sub-pixel adjacent thereto can constitute a light-emitting pixel (three sub-pixels covered with a dotted triangle as illustrated in FIG. 7), so that the image can be displayed at a high resolution using a physical low resolution through borrowing between the sub-pixels.

Furthermore, the pixel arrangement structure according to the embodiment of the disclosure is different from the traditional arrangement structure of RGB pixels in that the first sub-pixels 01, the second sub-pixels 02, and the third sub-pixels 03 can be arranged densely under the same process condition so that the area of a sub-pixel can be made as large as possible while the smallest spacing between sub-pixels is satisfied, to thereby lower driving current in the display device, and prolong the service lifetime of the display device.

Optionally, in the pixel arrangement structure according to the embodiment of the disclosure, the first sub-pixels, the second sub-pixels, and the third sub-pixels are one of blue sub-pixels, red sub-pixels, and green sub-pixels respectively, and for example, the first sub-pixels are red sub-pixels, the second sub-pixels are green sub-pixels, and the third sub-pixels are blue sub-pixels; or the first sub-pixels are green sub-pixels, the second sub-pixels are red sub-pixels, and the third sub-pixels are blue sub-pixels; or the first sub-pixels are blue sub-pixels, the second sub-pixels are red sub-pixels, and the third sub-pixels are green sub-pixels, although the embodiment of the disclosure will not be limited thereto.

Optionally, in the pixel arrangement structure according to the embodiment of the disclosure, as illustrated in FIG. 7, a red sub-pixel R together with a green sub-pixel G and a blue sub-pixel B adjacent thereto can constitute a light-emitting pixel (three sub-pixels covered with the dotted triangle as illustrated in FIG. 7), so that an image can be displayed at a high resolution using a physical low resolution through borrowing between the sub-pixels.

In an optional implementation, sub-pixels in different colors generally have different service lifetimes, so the areas of the sub-pixels can be set according to the service lifetimes of the sub-pixels, and generally the area of a sub-pixel with the shortest service lifetime is set to be the largest.

Since the service lifetime of a blue sub-pixel in the existing organic light-emitting material is the shortest, optionally in the pixel arrangement structure according to the embodiment of the disclosure, the area of a blue sub-pixel is larger than the area of a green sub-pixel, and the area of a blue sub-pixel is larger than the area of a red sub-pixel.

Optionally, in the pixel arrangement structure according to the embodiment of the disclosure, the area of a red sub-pixel can be equal to the area of a green sub-pixel, or the area of a red sub-pixel can be set larger than the area of a green sub-pixel, or the area of a red sub-pixel can be set larger than the area of a red sub-pixel, although the embodiment of the disclosure will not be limited thereto.

It shall be noted that in the pixel arrangement structure according to the embodiment of the disclosure, the shapes of the two first sub-pixels in each repeating element may or may not be the same, although the embodiment of the disclosure will not be limited thereto.

Furthermore, when the shapes of the two first sub-pixels in each repeating element are the same, arrangement angles of the two first sub-pixels may or may not be the same, although the embodiment of the disclosure will not be limited thereto.

Figure 2:
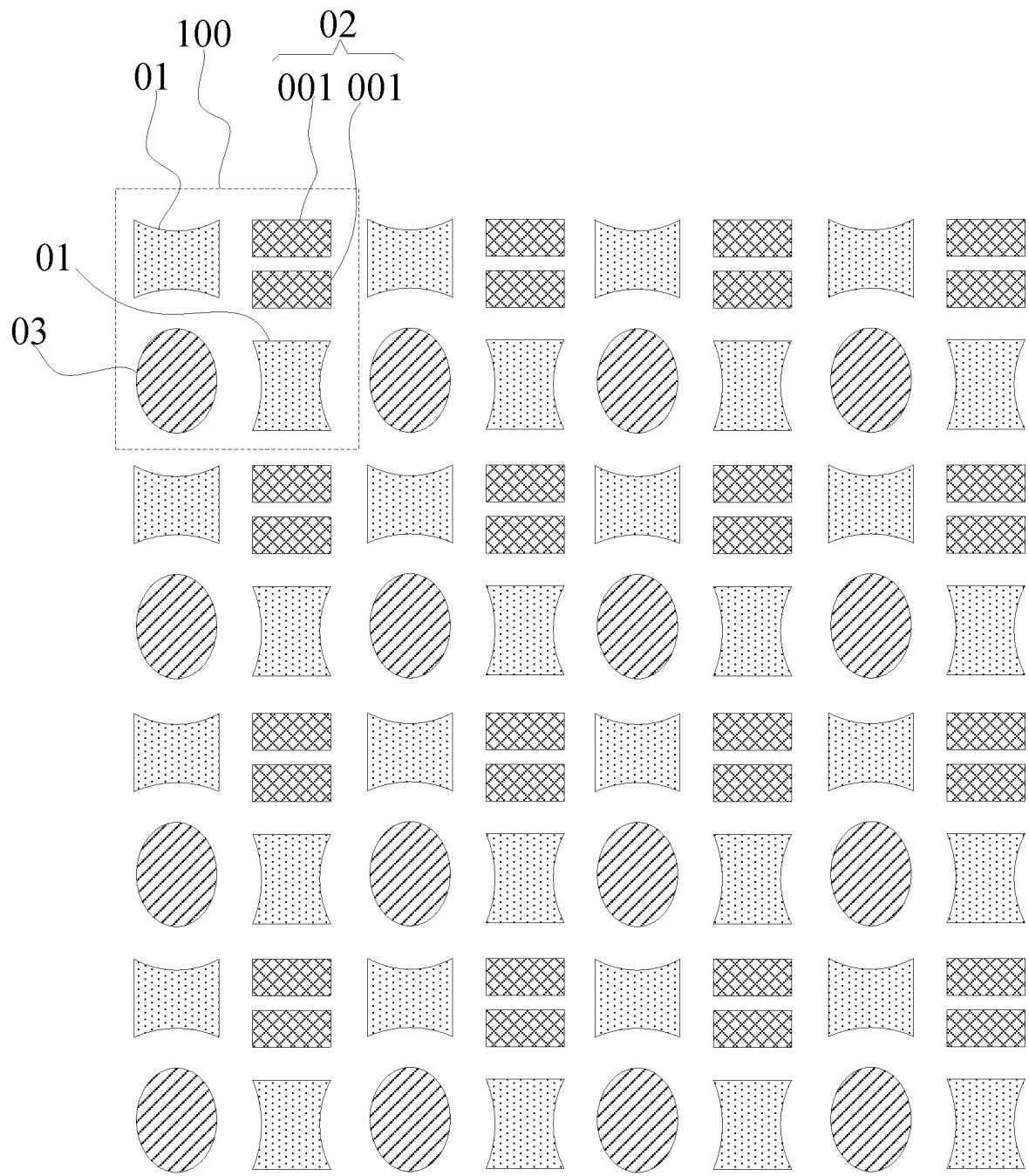
FIG. 2 is a schematic structural diagram of another pixel arrangement structure according to an embodiment of the disclosure.
Figure 3:
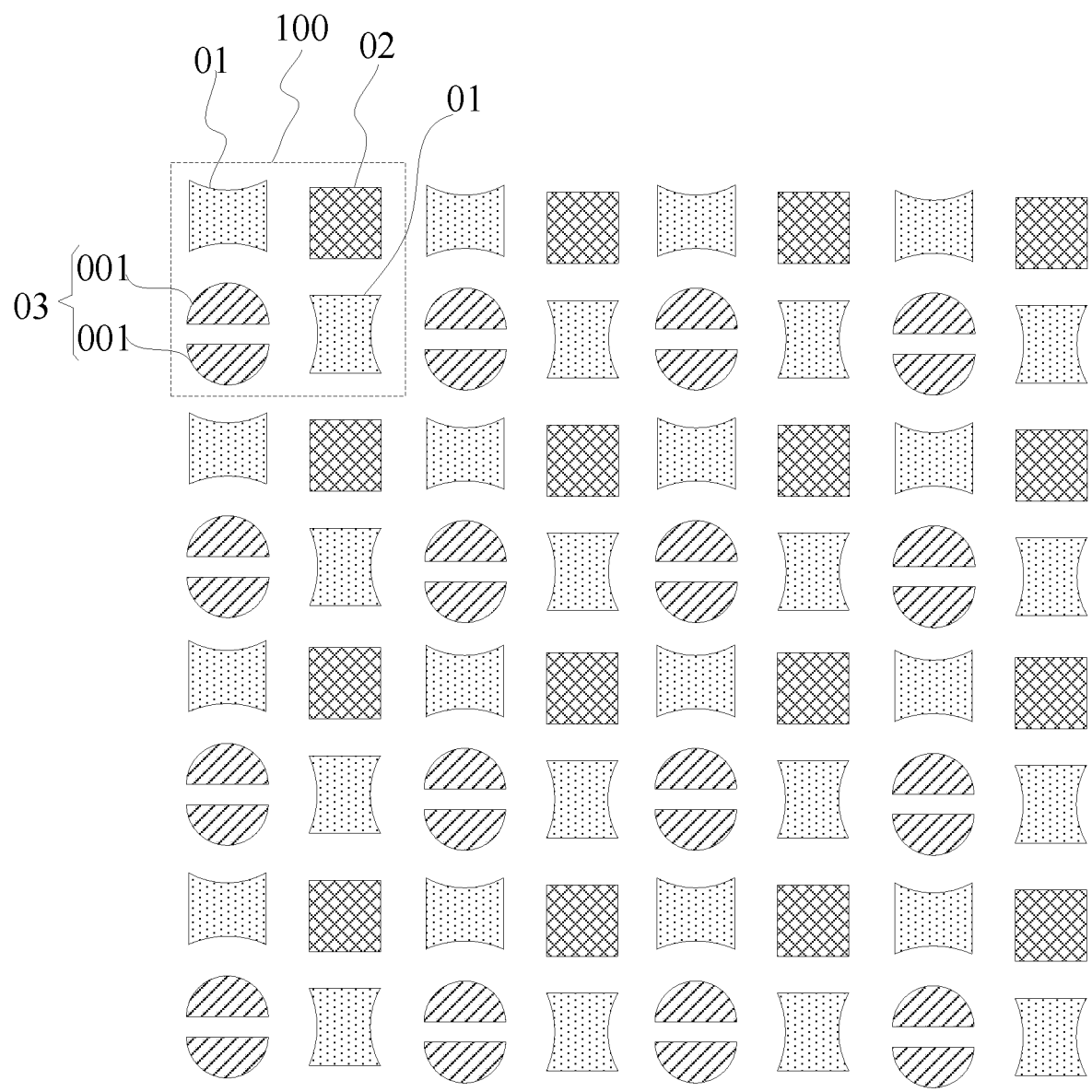
FIG. 3 is a schematic structural diagram of a further pixel arrangement structure according to an embodiment of the disclosure.
Figure 4:
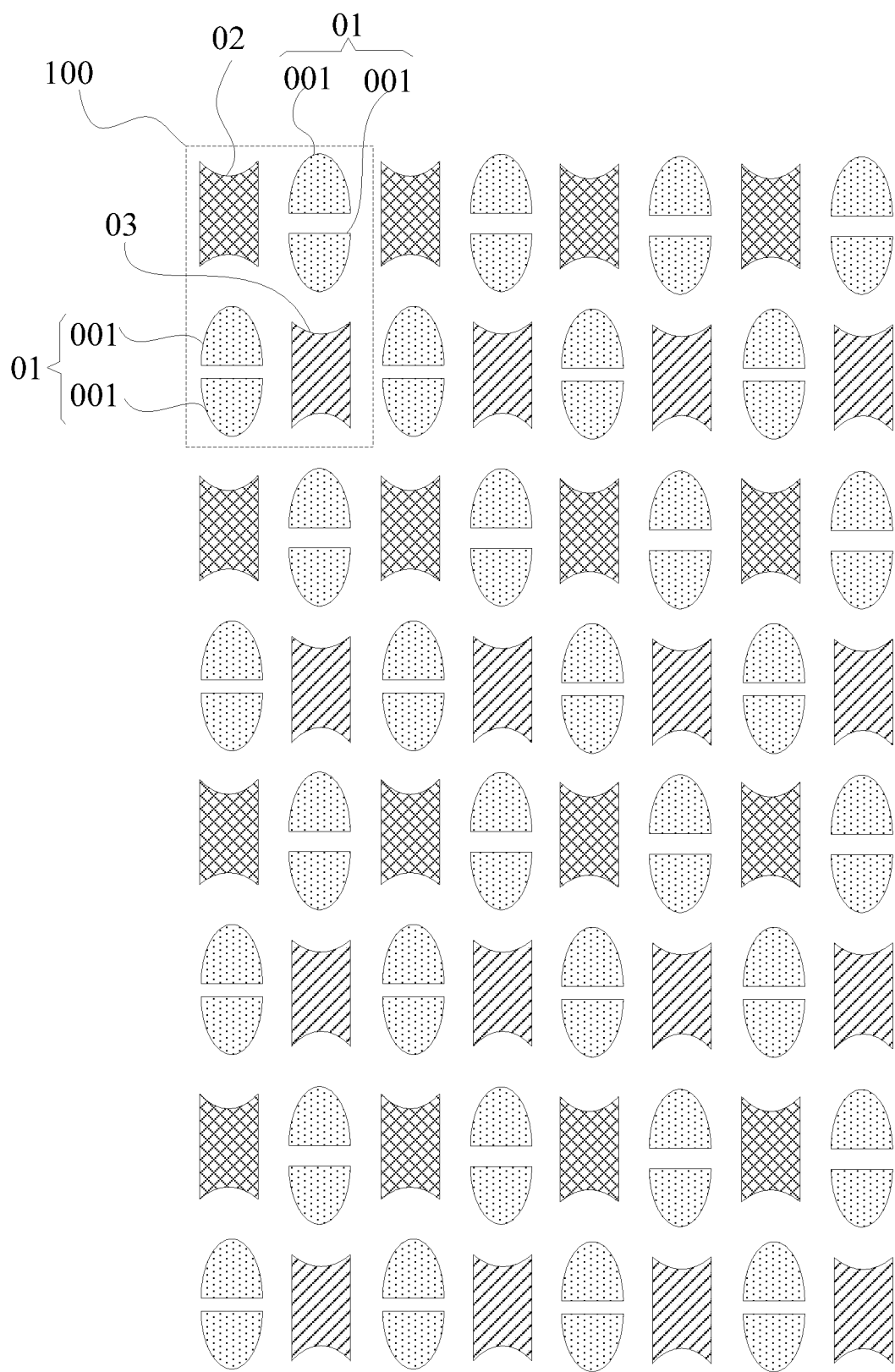
FIG. 4 is a schematic structural diagram of a further pixel arrangement structure according to an embodiment of the disclosure.
Figure 5:
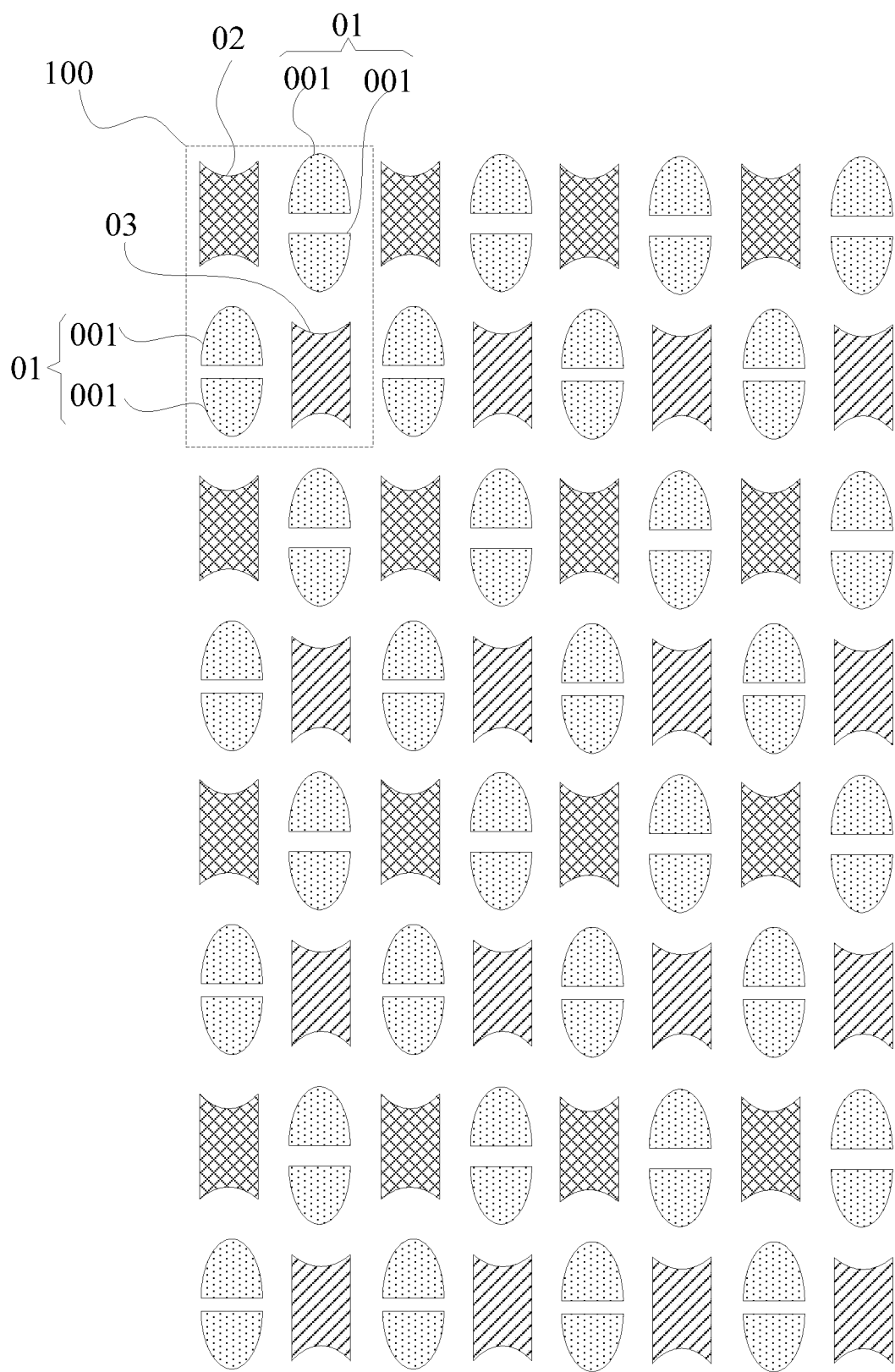
FIG. 5 is a schematic structural diagram of a further pixel arrangement structure according to an embodiment of the disclosure.
Figure 6:
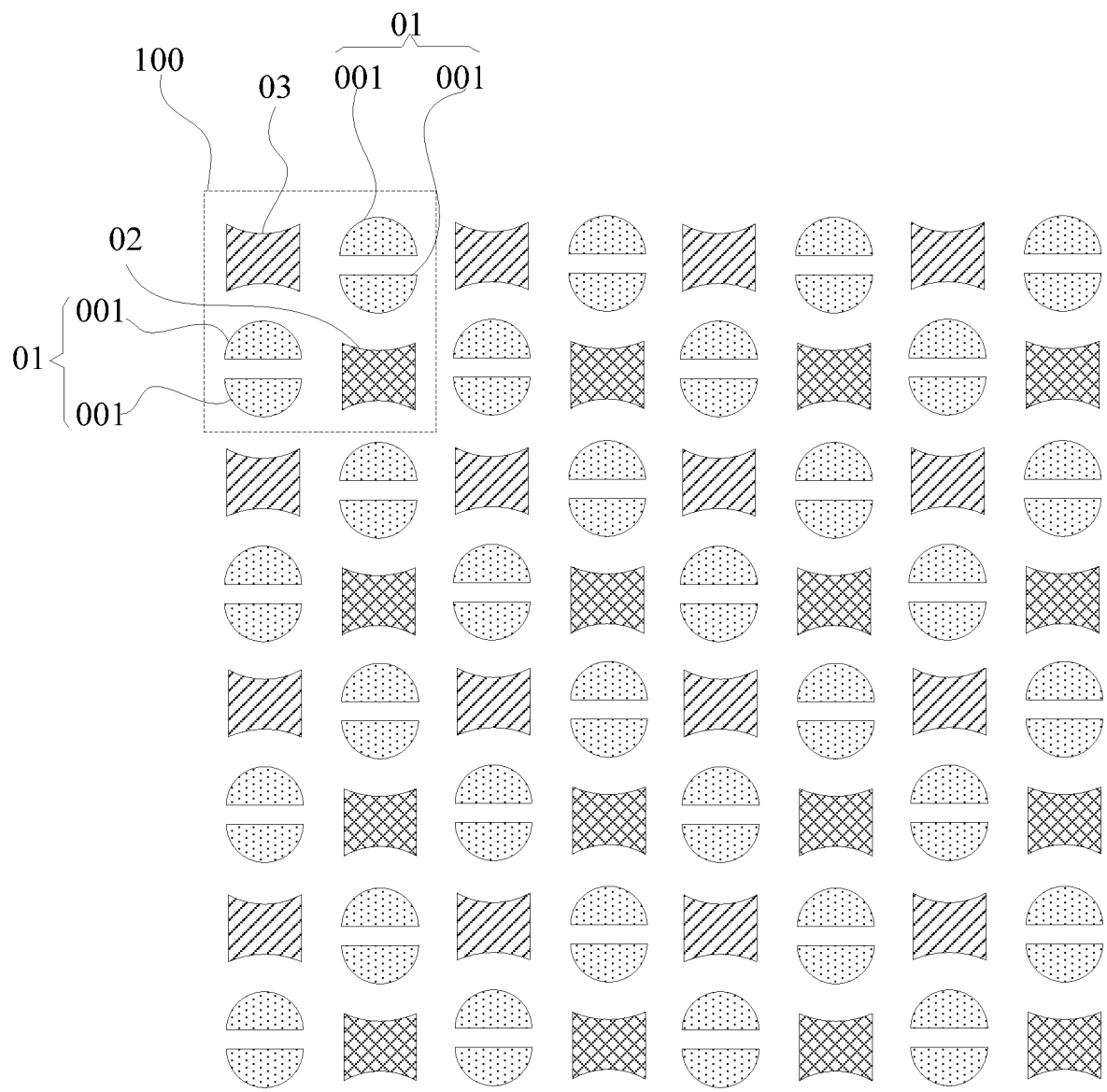
FIG. 6 is a schematic structural diagram of a further pixel arrangement structure according to an embodiment of the disclosure.

Optionally, in the pixel arrangement structure according to the embodiment of the disclosure, as illustrated in FIG. 4 and FIG. 6, each first sub-pixel 01 includes two sub-pixel components 001 arranged in a mirror pattern; or as illustrated in FIG. 2, each second sub-pixel 02 includes two sub-pixel components 001 arranged in a mirror pattern; or as illustrated in FIG. 3 and FIG. 5, each third sub-pixel 03 includes two sub-pixel components 001 arranged in a mirror pattern.

Optionally, in the pixel arrangement structure according to the embodiment of the disclosure, in order to guarantee a uniform width of the gap between the two sub-pixel components 001 arranged in a mirror pattern to thereby reduce the spacing between the two sub-pixel components 001, as illustrated in FIG. 2 to FIG. 6, facing sides of two sub-pixel components 001 arranged in a mirror pattern in the same sub-pixel are parallel to each other. In an optional implementation, the facing sides of the two sub-pixel components 001 may alternatively be not parallel to each other, although the embodiment of the disclosure will not be limited thereto.

Optionally, in the pixel arrangement structure according to the embodiment of the disclosure, as illustrated in FIG. 1 to FIG. 6, the shapes of the first sub-pixels 01, the second sub-pixels 02, and the third sub-pixels 03 can be a polygon, e.g., a rectangle, a pentagon, a normal hexagon, a normal octagon, etc., or may be a round, an ellipse, or another regular pattern, or can be an irregular pattern, although the embodiment of the disclosure will not be limited thereto.

Optionally, in the pixel arrangement structure according to the embodiment of the disclosure, the shape of the sub-pixel components can be a regular pattern, or can be an irregular pattern, although the embodiment of the disclosure will not be limited thereto.

In an optional implementation, there is such a limiting vapor-plating process that if there are less corners on the edge of a sub-pixel, that is, the edge appears more like an arc, then it will be more difficult for a stress to be concentrated in the vapor-plating process, and thus easier for the vapor-plating process to be performed. Optionally, in the pixel arrangement structure according to the embodiment of the disclosure, the shape of the sub-pixel components 001 is a semicircle as illustrated in FIG. 3, FIG. 5, and FIG. 6, or the shape of the sub-pixel components 001 is a semi-ellipse as illustrated in FIG. 4.

Optionally, in the display panel, traveling lines generally extend in the row or column direction, so in order to facilitate routing of the lines, optionally in the pixel arrangement structure according to the embodiment of the disclosure, two sub-pixel components 001 arranged in a mirror pattern in the same sub-pixel are arranged in the row direction as illustrated in FIG. 5, or two sub-pixel components 001 arranged in a mirror pattern in the same sub-pixel are arranged in the column direction as illustrated in FIG. 2, FIG. 3, FIG. 4, and FIG. 6. Of course, in an optional implementation, the two sub-pixel components 001 arranged in a mirror pattern can alternatively be arranged in another direction, although the embodiment of the disclosure will not be limited thereto.

Optionally, in the pixel arrangement structure according to the embodiment of the disclosure, as illustrated in FIG. 3 to FIG. 6, the shape of a sub-pixel adjacent to a sub-pixel component 001 in the column direction is an abnormally-shaped quadrilateral, and the side of the abnormally-shaped quadrilateral proximate to the sub-pixel component 001 is an inward concave arc, so that on one hand, the difficulty of vapor-plating a first sub-pixel 01 can be lowered, and on the other hand, a uniform width of the gap between a first sub-pixel 01 and a second sub-pixel 02 can be guaranteed, thus making the opening ratio of a pixel as high as possible while avoiding color crosstalk.

Optionally, in the pixel arrangement structure according to the embodiment of the disclosure, as illustrated in FIG. 3 to FIG. 6, the shape of a sub-pixel adjacent to a sub-pixel component 001 in the row direction is an abnormally-shaped quadrilateral, and the side of the abnormally-shaped quadrilateral proximate to the sub-pixel component 001 is an inward concave arc, so that on one hand, the difficulty of vapor-plating the abnormally-shaped quadrilateral sub-pixel can be lowered, and on the other hand, a uniform width of the gap between the sub-pixels can be guaranteed, thus making the opening ratio of a pixel as high as possible while avoiding color crosstalk.

Optionally, in the pixel arrangement structure according to the embodiment of the disclosure, in order to guarantee a uniform width of the gap between adjacent sub-pixels in the column direction to thereby reduce the spacing between adjacent sub-pixels in the column direction, facing sides of two adjacent sub-pixels (01 and 03, or 01 and 02) in the column direction are parallel to each other as illustrated in FIG. 1 to FIG. 6. Of course, in a particular implementation, facing sides of two adjacent sub-pixels in the column direction may alternatively be not parallel to each other, although the embodiment of the disclosure will not be limited thereto.

Optionally, in the pixel arrangement structure according to the embodiment of the disclosure, in order to guarantee a uniform width of the gap between adjacent sub-pixels in the row direction to thereby reduce the spacing between adjacent sub-pixels in the row direction, facing sides of two adjacent sub-pixels (01 and 03, or 01 and 02) in the row direction are parallel to each other as illustrated in FIG. 2, FIG. 3, and FIG. 5. Of course, in a particular implementation, facing sides of two adjacent sub-pixels in the row direction may alternatively be not parallel to each other, although the embodiment of the disclosure will not be limited thereto.

Optionally, in the pixel arrangement structure according to the embodiment of the disclosure, the smallest spacings between each two adjacent sub-pixels in the row direction are equal; and/or the smallest spacings between each two adjacent sub-pixels in the column direction are equal.

Optionally, in the pixel arrangement structure according to the embodiment of the disclosure, the smallest spacings between each two adjacent sub-pixels in the row direction are equal to the smallest spacings between each two adjacent sub-pixels in the column direction, so that the pixels can be distributed uniformly on the display panel.

Optionally, in the pixel arrangement structure according to the embodiment of the disclosure, the smallest spacing between adjacent sub-pixels shall be larger than or equal to a process extreme distance to thereby satisfy a process demand.

Particularly, the process extreme distance is generally dependent upon a fabrication process in use, and when a pixel is patterned in an etching process using a metal mask, optionally a Fine Metal Mask (FMM), the process extreme distance is approximately 16 μm, or when a pixel is patterned in a laser, electroforming, etc., process, the process extreme distance is shorter.

Optionally, in the pixel arrangement structure according to the embodiment of the disclosure, the spacing between two sub-pixel components arranged in a mirror pattern in the same sub-pixel can be less than the spacing between two adjacent sub-pixels because if the spacing between adjacent sub-pixels is too small, then color crosstalk will tend to occur, and since the colors of two sub-pixel components in the same sub-pixel are the same, their spacing may be set smaller.

Optionally, in the pixel arrangement structure according to the embodiment of the disclosure, the particular shapes, positional relationship, etc., of the first sub-pixels 01, the second sub-pixels 02, and the third sub-pixels 03 can be designed as needed, and in a real process, some error may occur due to a limiting process condition or another factor, so the shapes, positions, and relative positional relationship of the respective sub-pixels in the pixel arrangement structure according to the embodiment of the disclosure may roughly satisfy the condition above without departing the scope of the disclosure.

Figure 8A:
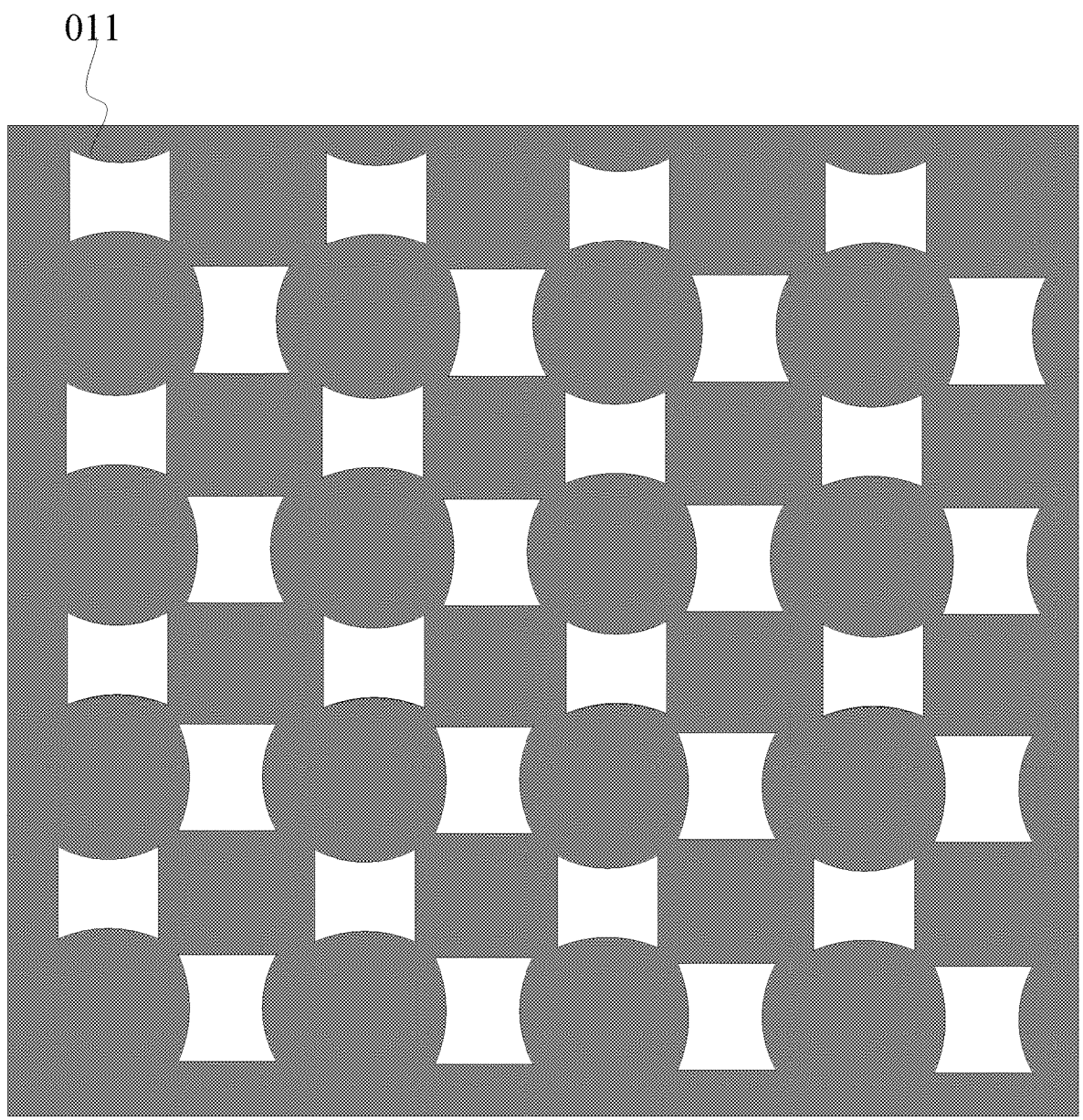
FIG. 8A is a schematic structural diagram of a metal mask corresponding to first sub-pixels in FIG. 3 according to an embodiment of the disclosure.
Figure 8B:
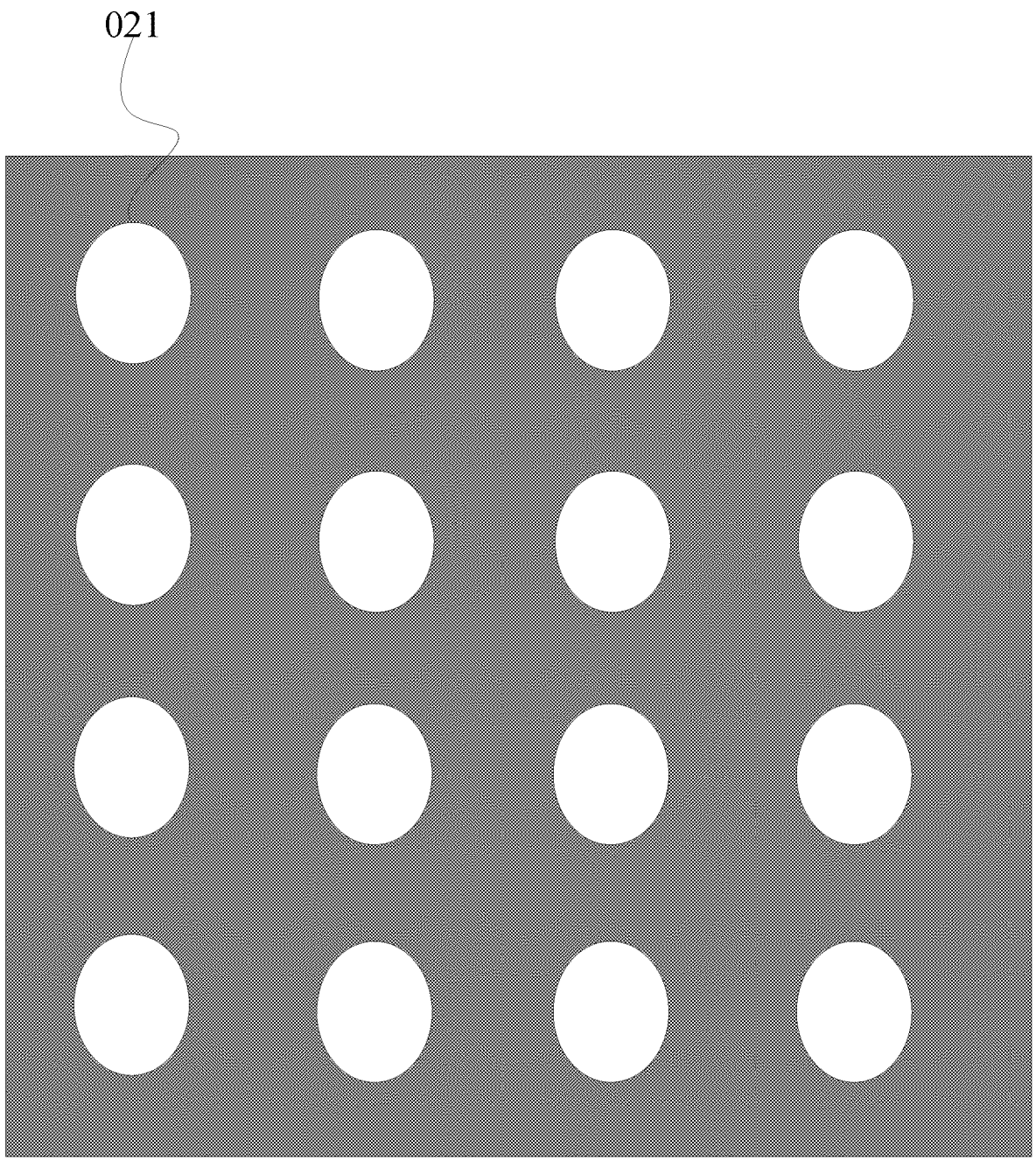
FIG. 8B is a schematic structural diagram of a metal mask corresponding to second sub-pixels in FIG. 3 according to an embodiment of the disclosure.
Figure 8C:
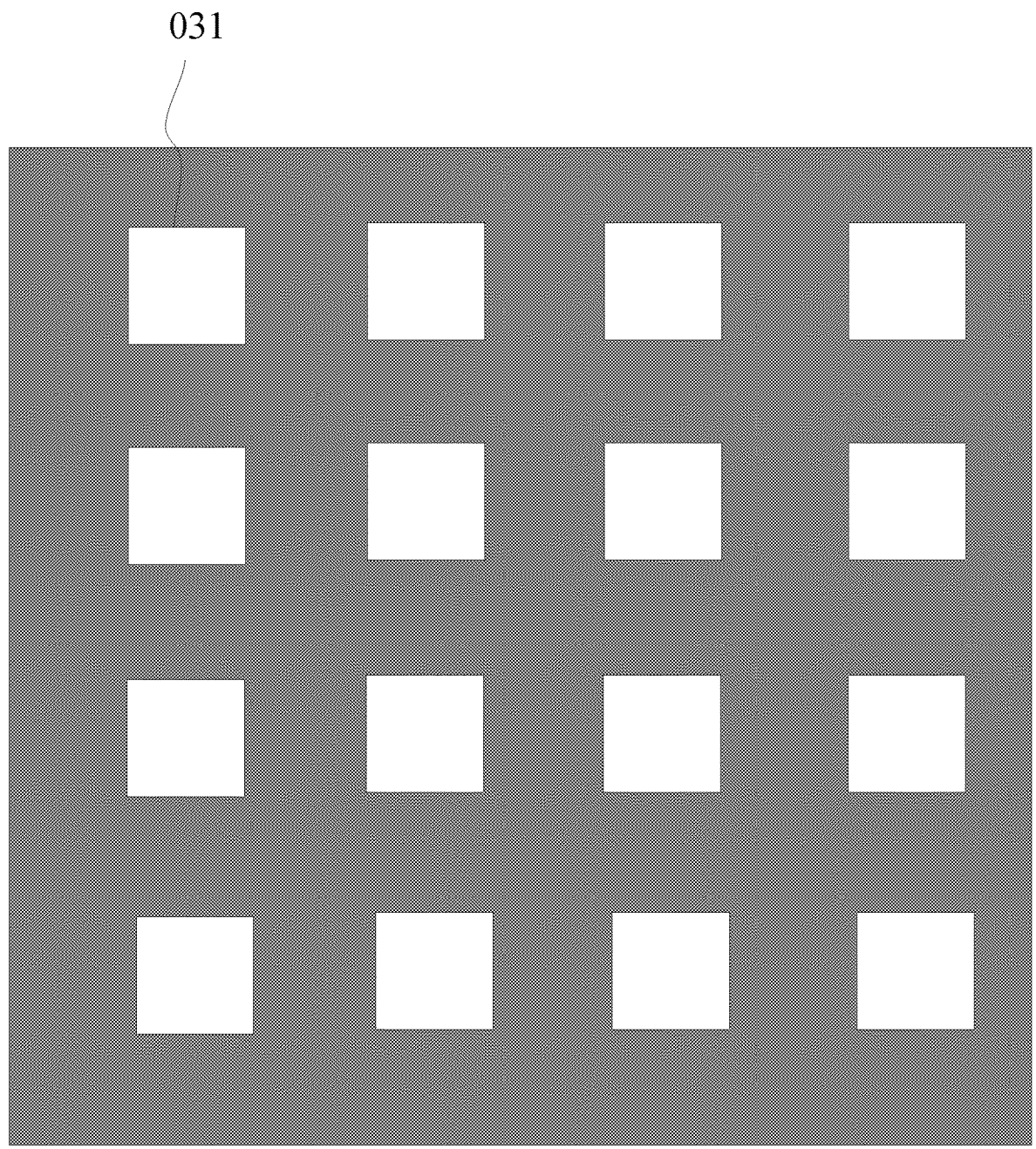
FIG. 8C is a schematic structural diagram of a metal mask corresponding to third sub-pixels in FIG. 3 according to an embodiment of the disclosure.

Based upon the same inventive idea, an embodiment of the disclosure further provides a metal mask for fabricating the pixel arrangement structure above according to the embodiment of the disclosure, and as illustrated in FIG. 8A to FIG. 8C, the metal mask includes a plurality of opening areas 011, 012, or 013, where the opening areas 011 correspond in shape and position to the first sub-pixels 01 as illustrated in FIG. 8A, or the opening areas 012 correspond in shape and position to the second sub-pixels 02 as illustrated in FIG. 8B, or the opening areas 013 correspond in shape and position to the third sub-pixels 03 as illustrated in FIG. 8C.

In an optional implementation, since it is generally not easy to vapor-plating the edge of an opening area, the area of an opening area corresponding to a sub-pixel is generally larger than the area of the sub-pixel in the metal mask, and ideally the width of the opening area is larger than the width of the sub-pixel by a half of the width of the gap between two sub-pixels.

Optionally, FIG. 8A illustrates a structural diagram of a Fine Metal Mask (FMM) for fabricating the first sub-pixels 01 in FIG. 3, FIG. 8B illustrates a structural diagram of a Fine Metal Mask (FMM) for fabricating the third sub-pixels 03 in FIG. 3, and FIG. 8C illustrates a structural diagram of a Fine Metal Mask (FMM) for fabricating the second sub-pixels 02 in FIG. 3. As can be apparent, the opening areas in FIG. 8A to FIG. 8C are distributed uniformly in the mask so that a stress of an organic material can be distributed uniformly in a vapor-plating process to thereby make the vapor-plating process less difficult.

It shall be noted that when a sub-pixel includes two sub-pixel components, organic light-emitting layers of the two sub-pixel components can be connected together, and anodes of the two sub-pixel components can be separate from each other, so the shape of an opening area in a corresponding fine metal mask is the same as a shape consisted of outer edges of the two sub-pixel components, and as illustrated in FIG. 3, a third sub-pixel 03 includes two sub-pixel components 001 in the shape of a semicircle, but a pattern consisted of outer edges of the two sub-pixel components 001 is elliptic, so the shape of an opening area in a fine metal mask corresponding to the third sub-pixel 03 as illustrated in FIG. 8B.

Optionally, the pixel arrangement structure above is formed using the fine metal mask above by firstly combining the respective fine metal masks as illustrated in FIG. 8A to FIG. 8C with a cover mask, a howling mask, and an alignment mask into a Mask Frame Assembly (MFA) and then placing the resulting MFA into a corresponding vapor-plating chamber, and vapor-plating an organic light-emitting material corresponding to the respective sub-pixels. In an optional implementation, only one type of sub-pixels can be patterned at a time, so after one type of sub-pixels are patterned, another type of sub-pixels are patterned, and after the three types of sub-pixels are patterned sequentially, the pixel arrangement structure as illustrated in FIG. 3 can be obtained.

Based upon the same inventive idea, an embodiment of the disclosure further provides a display device including the pixel arrangement structure according to any one of the embodiments above of the disclosure. The display device can be a mobile phone, a tablet computer, a TV set, a monitor, a notebook computer, a digital photo frame, a navigator, or any other product or component with a display function. Reference can be made to the embodiment of the pixel arrangement structure above for an implementation of the display device, and a repeated description thereof will be omitted here.

In the pixel arrangement structure, the metal mask, and the display device above according to the embodiments of the disclosure, each repeating element in the pixel arrangement structure includes four sub-pixels distributed in two rows by two columns, where the four sub-pixels include two first sub-pixels in different rows and different columns, and one second sub-pixel and one third sub-pixel in different rows and different columns. While an image is being displayed, any one first sub-pixel together with one second sub-pixel adjacent thereto and one third sub-pixel adjacent thereto can constitute a light-emitting pixel, so that the image can be displayed at a high resolution using a physical low resolution through borrowing between the sub-pixels.

Evidently those skilled in the art can make various modifications and variations to the disclosure without departing from the spirit and scope of the disclosure. Thus the disclosure is also intended to encompass these modifications and variations thereto so long as the modifications and variations come into the scope of the claims appended to the disclosure and their equivalents.

The invention claimed is:

1. A pixel arrangement structure, comprising a plurality of repeating elements arranged in a matrix, wherein each of the repeating elements comprises four sub-pixels distributed in two rows by two columns, and the four sub-pixels comprise two first sub-pixels in different rows and different columns, and one second sub-pixel and one third sub-pixel; the second sub-pixel and the third sub-pixel are in different rows and different columns;

wherein adjacent first sub-pixels within any two directly adjacent repeating elements of the plurality of repeating elements are separated by the second sub-pixel only or the third sub-pixel only in both of a column direction and a row direction;

wherein the pixel arrangement structure further comprises at least one of following features;

each of the first sub-pixels comprises two sub-pixel components arranged in a mirror pattern;

the second sub-pixel comprises two sub-pixel components arranged in a mirror pattern; or the third sub-pixel comprises two sub-pixel components arranged in a mirror pattern;

wherein facing sides of two sub-pixel components arranged in a mirror pattern in a same sub-pixel are not parallel to each other;

wherein the two sub-pixel components arranged in a mirror pattern are arranged in a row direction.

2. The pixel arrangement structure according to claim 1, wherein a shape of the sub-pixel components is a semicircle or a semi-ellipse, and the shape of the sub-pixel components is complementary to a shape of the sub-pixels which are adjacent to the sub-pixel components in the row direction and/or a column direction.

3. The pixel arrangement structure according to claim 1, wherein a shape of a sub-pixel adjacent to a sub-pixel component in the column direction is an abnormally-shaped quadrilateral, and a side of the abnormally-shaped quadrilateral proximate to the sub-pixel component is an inward concave arc, or wherein a shape of a sub-pixel adjacent to a sub-pixel component in the row direction is an abnormally-shaped quadrilateral, and a side of the abnormally-shaped quadrilateral proximate to the sub-pixel component is an inward concave arc.

4. The pixel arrangement structure according to claim 1, wherein facing sides of two adjacent sub-pixels in a column direction are parallel to each other; or wherein facing sides of two adjacent sub-pixels in a row direction are parallel to each other.

5. The pixel arrangement structure according to claim 1, wherein the first sub-pixels, the second sub-pixel, and the third sub-pixel are one of a blue sub-pixel, a red sub-pixel, and a green sub-pixel; the first sub-pixels, the second sub-pixel and the third sub-pixel are different in color;
wherein an area of the blue sub-pixel is larger than an area of the green sub-pixel, and an area of the blue sub-pixel is larger than an area of the red sub-pixel.

6. The pixel arrangement structure according to claim 1, further comprising at least one of following features:
smallest spacings between each two adjacent sub-pixels in a row direction are equal; and
smallest spacings between each two adjacent sub-pixels in a column direction are equal.

7. The pixel arrangement structure according to claim 6, wherein the smallest spacings between each two adjacent sub-pixels in the row direction are equal to the smallest spacings between each two adjacent sub-pixels in the column direction.

8. A display device, comprising the pixel arrangement structure according to claim 1.

9. The display device according to claim 8, wherein the pixel arrangement structure comprises at least one of following features:
each of the first sub-pixels comprises two sub-pixel components arranged in a mirror pattern;
the second sub-pixel comprises two sub-pixel components arranged in a mirror pattern; or
the third sub-pixel comprises two sub-pixel components arranged in a mirror pattern.

10. The display device according to claim 9, wherein facing sides of two sub-pixel components arranged in a mirror pattern in a same sub-pixel are parallel to each other.

11. The display device according to claim 10, wherein a shape of the sub-pixel components is a semicircle or a semi-ellipse.

12. The display device according to claim 11, wherein the two sub-pixel components arranged in a mirror pattern are arranged in a row or column direction.

13. The display device according to claim 12, wherein a shape of a sub-pixel adjacent to a sub-pixel component in the column direction is an abnormally-shaped quadrilateral, and a side of the abnormally-shaped quadrilateral proximate to the sub-pixel component is an inward concave arc.

14. The pixel arrangement structure according to claim 1, wherein the first sub-pixels are green sub-pixels, the second sub-pixel is one of a red sub-pixel and a blue sub-pixel, and the third sub-pixel is one of a red pixel and a blue pixel, and a color of the second sub-pixel is different from a color of the third sub-pixel;
or
the first sub-pixels are blue pixels, the second sub-pixel is one of a red sub-pixel and a green sub-pixel, and the third sub-pixel is one of a red pixel and a green pixel, and a color of the second sub-pixel is different from a color of the third sub-pixel.

15. The pixel arrangement structure according to claim 1, wherein in response to that each of the first sub-pixels comprises two sub-pixel components arranged in a mirror pattern, a ratio of numbers of the second sub-pixel, the third sub-pixel and the sub-pixel components is 1:1:4.

16. The pixel arrangement structure according to claim 1, wherein any first sub-pixel together with the second sub-pixel adjacent thereto and the third sub-pixel adjacent thereto constitute a light-emitting pixel.

17. The pixel arrangement structure according to claim 1, wherein longer sides of the first sub-pixels are in different directions.

* * * * *